US010666259B1

(12) United States Patent
Mora et al.

(10) Patent No.: US 10,666,259 B1
(45) Date of Patent: May 26, 2020

(54) CURRENT STEERING LEVEL-SHIFTER

(71) Applicant: Intel Corporation, Santa Clara, CA (US)

(72) Inventors: Andres Malavasi Mora, Hillsboro, OR (US); Jaydeep Kulkarni, Portland, OR (US); Anupama Thaploo, Folsom, CA (US); Muhammad Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/229,617

(22) Filed: Dec. 21, 2018

(51) Int. Cl.
*H03K 19/082* (2006.01)
*H03K 19/0175* (2006.01)
*H03K 19/0948* (2006.01)

(52) U.S. Cl.
CPC ... *H03K 19/082* (2013.01); *H03K 19/017509* (2013.01); *H03K 19/0948* (2013.01)

(58) Field of Classification Search
None
See application file for complete search history.

(56) References Cited

U.S. PATENT DOCUMENTS

| | | | | |
|---|---|---|---|---|
| 2012/0313686 A1* | 12/2012 | Kikuchi | ......... | H03K 19/018521 327/333 |
| 2014/0223205 A1* | 8/2014 | Muthukaruppan | ....... | G06F 1/32 713/320 |
| 2016/0173092 A1* | 6/2016 | Trivedi | .......... | H03K 19/017509 327/333 |
| 2018/0026627 A1* | 1/2018 | Shin | ............... | H03K 19/018521 |
| 2019/0052254 A1* | 2/2019 | Hess | ...................... | H03K 5/159 |

OTHER PUBLICATIONS

Garg, Rajesh et al., "A Single-supply True Voltage Level Shifter", Department of Electrical & Computer Engineering, Texas A&M University, 2008, 6 pgs.
Kaul, Himanshu et al., "A 320mV 56uW 411GOPS/Watt Ultra-Low Voltage Motion Estimation Accelerator in 65nm CMOS", ISCC 2008, Session 16, Low-Power Digital, 16.6, 3 pgs.
Khan, Qadeer A. et al., "A Single Supply Level Shifter for Multi-Voltage Systems", Proceeding of the 19th International Conference on VLSI Design, 2006, 4 pgs.

* cited by examiner

*Primary Examiner* — Minh D A
*Assistant Examiner* — James H Cho
(74) *Attorney, Agent, or Firm* — Green, Howard & Mughal LLP

(57) ABSTRACT

Described is a level-shifter that can save area between voltage domains with limited voltage differential, and further save power by steering current between two power supply rails. The level-shifter comprises: an input to receive a first signal between a first reference rail and a second reference rail; an output to provide a second signal the first reference rail and a third reference rail, wherein in a voltage level of the third reference rail is higher than a voltage level of the second reference rail, and wherein a voltage level of the first reference is lower than the voltage level of the second reference rail and the third reference rail; and a circuitry coupled to the input and the output, wherein the circuitry is to steer current from the third reference rail to the second reference rail.

20 Claims, 14 Drawing Sheets

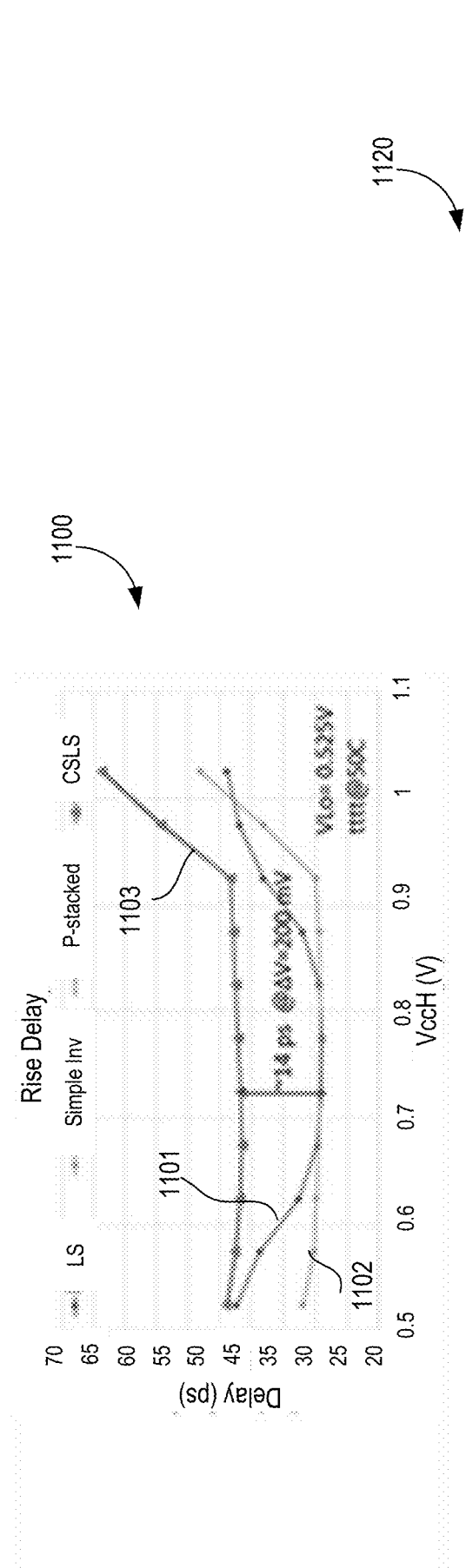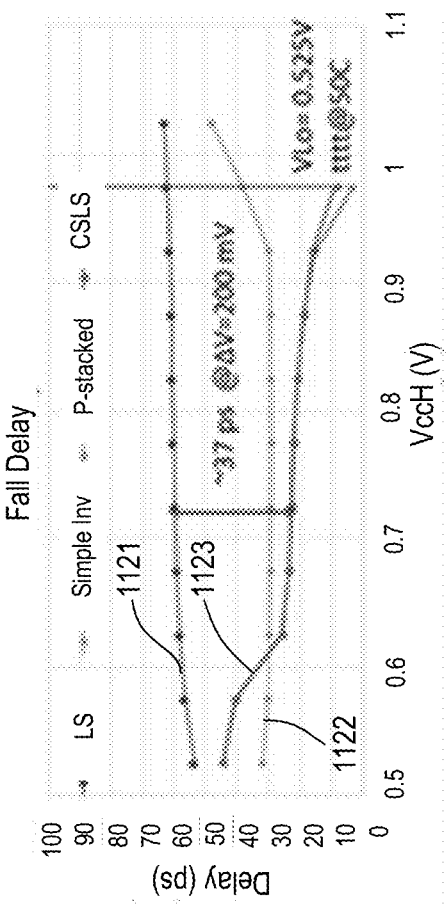
Fig. 11A
Fig. 11B

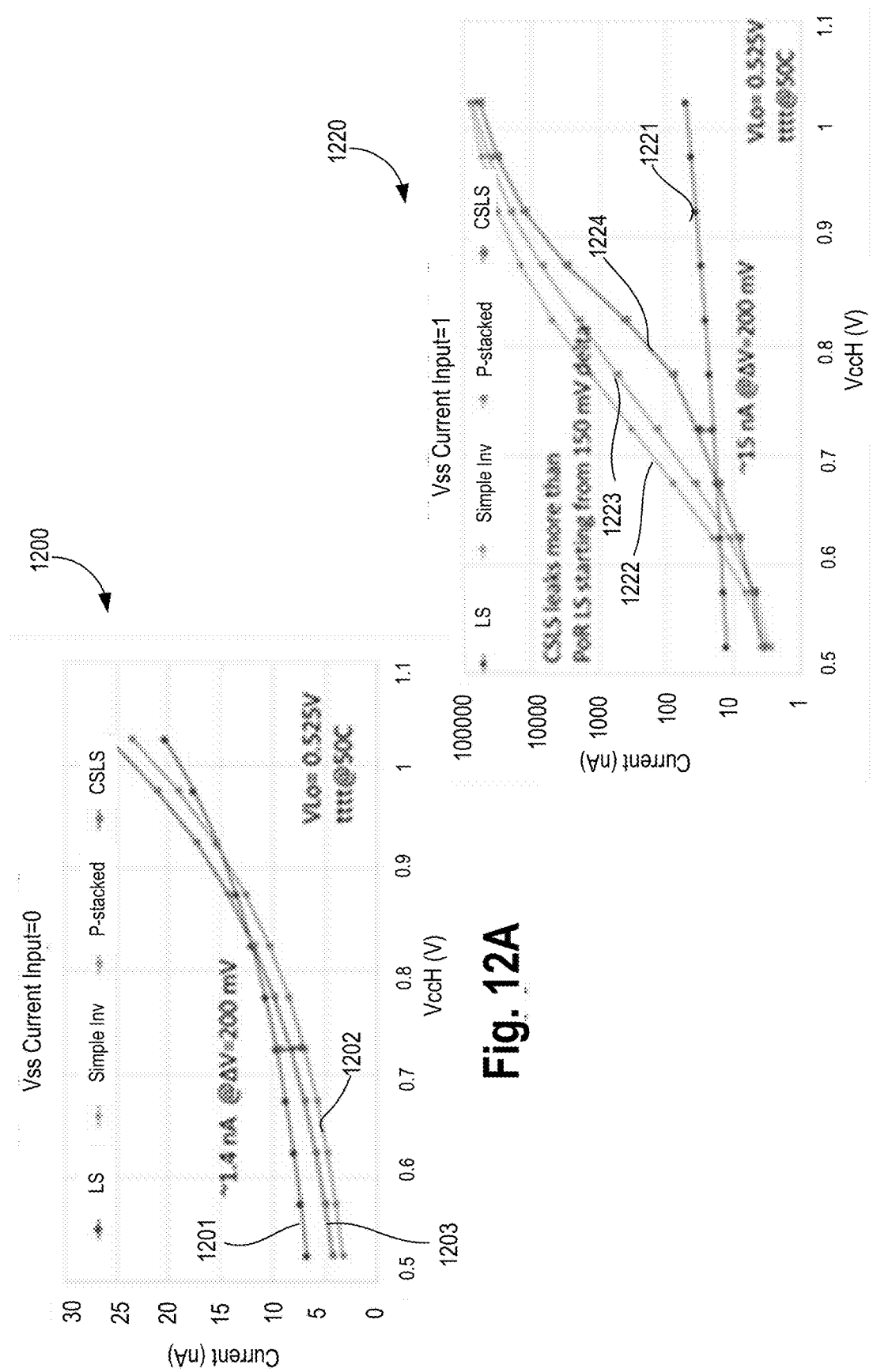

CURRENT STEERING LEVEL-SHIFTER

BACKGROUND

As technology scales, power optimization becomes a significant requirement for the system-on-chip (SoC) designs. Multi-voltage design is an effective approach to optimize power consumption of the SoC, and level shifters (LS) are a key components interfacing the multiple voltage domains. The increased number of multiple voltage domains has increased the use of level-shifters resulting in significant performance and area overheads. However, many of these voltage domains have limited voltage differential (e.g., less than 200 mV), and therefore using conventional large level-shifters can be expensive.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 11A-B illustrate plots comparing rise and fall delays of level-shifters of FIGS. 1A-C and the CSLS of FIG. 4, in accordance with some embodiments.

FIGS. 12A-B illustrate plots comparing Vss (or ground) current of level-shifters of FIGS. 1A-C and the CSLS of FIG. 4, in accordance with some embodiments.

DETAILED DESCRIPTION

Figure 1:
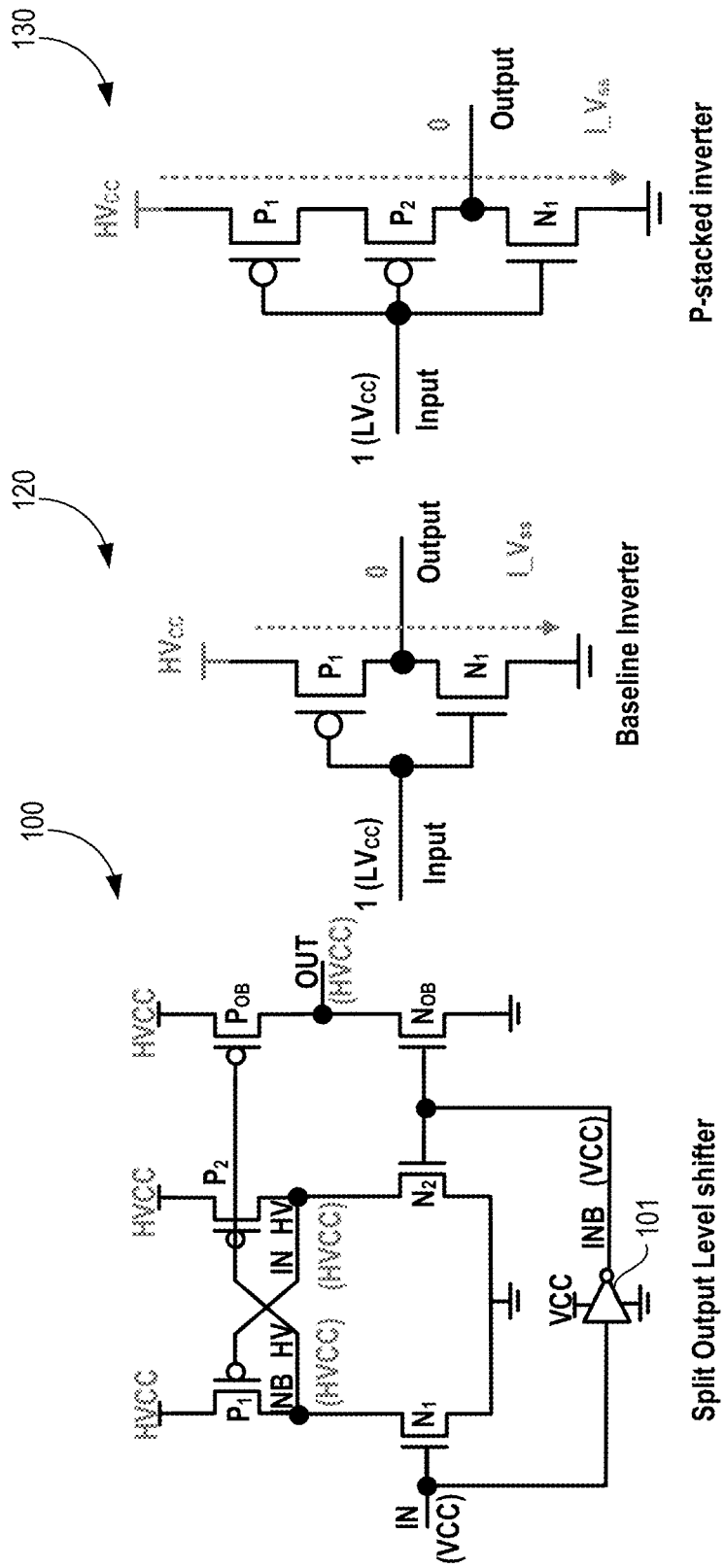
FIGS. 1A-C illustrate a split output level-shifter, an inverter as a level-shifter, and p-stacked inverter as level-shifter.

Some level-shifters use interrupted input (e.g., a split output level-shifter). These level-shifters use two voltage supplies, two N-wells, and are typically designed to support a wide voltage range. However, for small voltage differential, the split output level-shifters are overdesigned and consume large area and high Vss (ground) leakage. For small voltage differentials, simple inverter or buffer or P-stacked inverter or buffer can be used at the expense of increased short-circuit and/or sub-threshold leakage current.

The interruptible supply split output level-shifter is built to support a wide range of voltage differential, hence it may have two N-wells, which leads to an area overhead. Usually, level-shifters are placed at the interface of different blocks connected to different power domains, making this overhead more significant when the interface has hundreds or thousands of signals. In the cases of the simple or P-stacked inverters, such circuits are suitable for very small voltage differential range. When the voltage differential starts to increase beyond a few 10's of mV (e.g. higher than 50 mV), the leakage starts to increase significantly and simple or P-stacked inverters are no longer suitable for low power operation.

Some embodiments describe a compact level-shifter that steers current between the two input power supply rails (e.g., low power supply rail VccL and high power supply rail VccH). This level-shifter is also referred to as a current-steering level-shifter (CSLS). In some embodiments, the CSLS comprises a single N-well and 7T (seven transistor) level-shifter that can save area between voltage domains with limited voltage differential. Further power is saved by steering current between the input two rails.

There are many technical effects of the CSLS of various embodiments. For example, the CSLS circuitry topology are: 1) Compact due to their small number of transistors and single N-well design enabling smaller area (e.g., up to 3.7× smaller area) compared to standard cell LS used between power domains with limited voltage differential (e.g., less than approximately 200 mV); 2) a large current (e.g., greater than 94%) is steered from the high power supply rail (e.g., VccH) to the low power supply rail (e.g., VccL) resulting in lower overall Vss leakage compared to split output level-shifters; and 3) CSLS provides standard cell library compliance because it has pass-gate free input to avoid contention with the driving gate, and bi-directionality to support both low-to-high and high-to-low voltage signal conversions. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e g, immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device.

The term "between" may be employed in the context of the z-axis, x-axis or y-axis of a device. A device that is between two other devices may be directly connected to one or both of those devices, or it may be separated from both of the other two devices by one or more intervening devices.

Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIGS. 1A-C illustrate a split output level-shifter 100, an inverter as a level-shifter 120, and p-stacked inverter 130 as level-shifter. Split output level-shifter 100 includes input node IN, output node OUT, n-type transistors $N_1$, $N_2$, $N_{OB}$, p-type transistors $P_1$, $P_2$, and $P_{OB}$, internal nodes NB HV, IN NV, and INB, and inverter 101 coupled together as shown. Here inverter 101 operates on the low power supply (provided by low power supply rail VCC) while p-type transistors P1, P2, and POB are coupled to a high power supply rail HVCC providing a power supply voltage higher than VCC. The input IN is generated by a logic operating on VCC, and so IN toggles between VCC and ground. The output OUT is the level-shifted output that toggles between HVCC and ground. Inverter 120 of FIG. 1B comprises p-type transistor $P_1$, n-type transistor $N_1$, input node Input, and output node Output coupled together as shown. The input is generated by a logic operating on LVCC (low power supply), and so input toggles between LVCC and ground. The output is the level-shifted output that toggles between HVCC and ground. P-stacked inverter 130 of FIG. 1C comprises p-type transistors $P_1$ and $P_2$, n-type transistor $N_1$, input node Input, and output node Output coupled together as shown. The input is generated by a logic operating on LVCC (low power supply), and so the input toggles between LVCC and ground. The output is the level-shifted output that toggles between HVCC and ground.

For a small voltage differential, the split output level-shifter 100 is typically overdesigned and consumes large area and high Vss (ground) leakage. For small voltage differentials, inverter 120 or P-stacked inverter 130 can be used at the expense of increased short-circuit and/or sub-threshold leakage current I_Vss. The interruptible supply split output level-shifter 100 is built to support a wide range of voltage differential, hence it may have two N-wells, which leads to an area overhead. Usually the level-shifters are placed at the interface of different blocks connected to different power domains, making this overhead more significant when the interface has hundreds or thousands of signals. In the cases of inverter 120 or P-stacked inverter 130, they are suitable for very small voltage differential range. When the voltage differential starts to increase beyond a few 10's of mV (e.g. higher than 50 mV), the leakage I_Vss starts to increase significantly.

Figure 2:
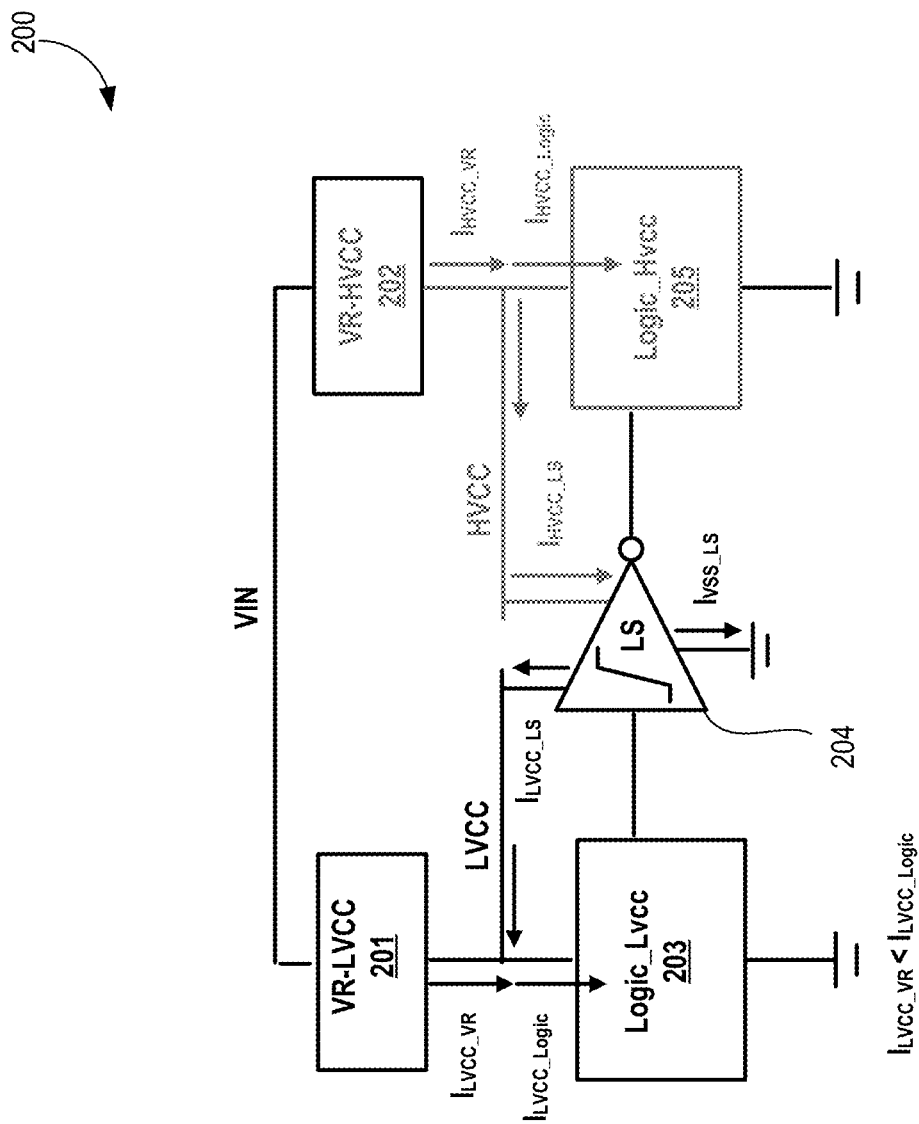
FIG. 2 illustrates a high-level architecture of a current steering level-shifter (CSLS), in accordance with some embodiments.

FIG. 2 illustrates a high-level architecture 200 of a current steering level-shifter (CSLS), in accordance with some embodiments. Architecture 200 comprises a first power supply generator 201, a second power supply generator 202, logic 203 operating on the first power supply, CSLS 204, and logic 205 operating on the second power supply. In this example, the first power supply is a low power supply LVCC, the second power supply is a high power supply HVCC. In some embodiments, first power supply generator 201 comprises a voltage regulator such as a buck DC-DC converter, boost DC-DC converter, low drop-out (LDO), switching DC-DC regulator etc. In some embodiments, second power supply generator 202 comprises a voltage regulator such as a buck DC-DC converter, boost DC-DC converter, low drop-out (LDO), switching DC-DC regulator etc. In some embodiments, both first and second power supply generators 201 and 202 receive input power supply VIN and provide regulated supplies LVCC and HVCC, respectively. The current provided by first power supply generator 201 is $I_{LVCC\_VR}$, the current provided by second power supply generator 202 is $I_{HVCC\_VR}$, the current provided to logic 203 is $I_{LVCC\_logic}$, and the current provided to logic 205 is $I_{HVCC\_logic}$.

In various embodiments, CSLS 204 steers current $I_{HVCC\_LS}$ from the high voltage rail HVCC to the low voltage rail LVCC current $I_{LVCC\_LS}$ instead of transferring to the Vss (or ground) rail. The steered current into low-voltage rail LVCC partially supports the required current of the low voltage domain thus reducing the current required from the LVCC rail supplied by the corresponding low-voltage generator 201. In some embodiments, the steered current $I_{LVCC\_LS}$ should be significantly lower than the low-voltage logic current $I_{LVCC\_Logic}$ requirement in order not to affect the feedback mechanism/stability of voltage generator 201 (e.g., by creating a voltage overshoot). This criteria of the steered current $I_{LVCC\_LS}$ being lower than $I_{LVCC\_Logic}$ depends on the number of level shifters on the LVCC rail, the voltage-differential between LVCC and HVCC, threshold voltage of the p-type pull-up transistors of the CSLS, etc. In most cases, for small voltage differentials, the above criterial may not be of concern as the steered current $I_{LVCC\_LS}$ is a very small fraction of the low voltage domain current $I_{LVCC\_VR}$.

Figure 3:
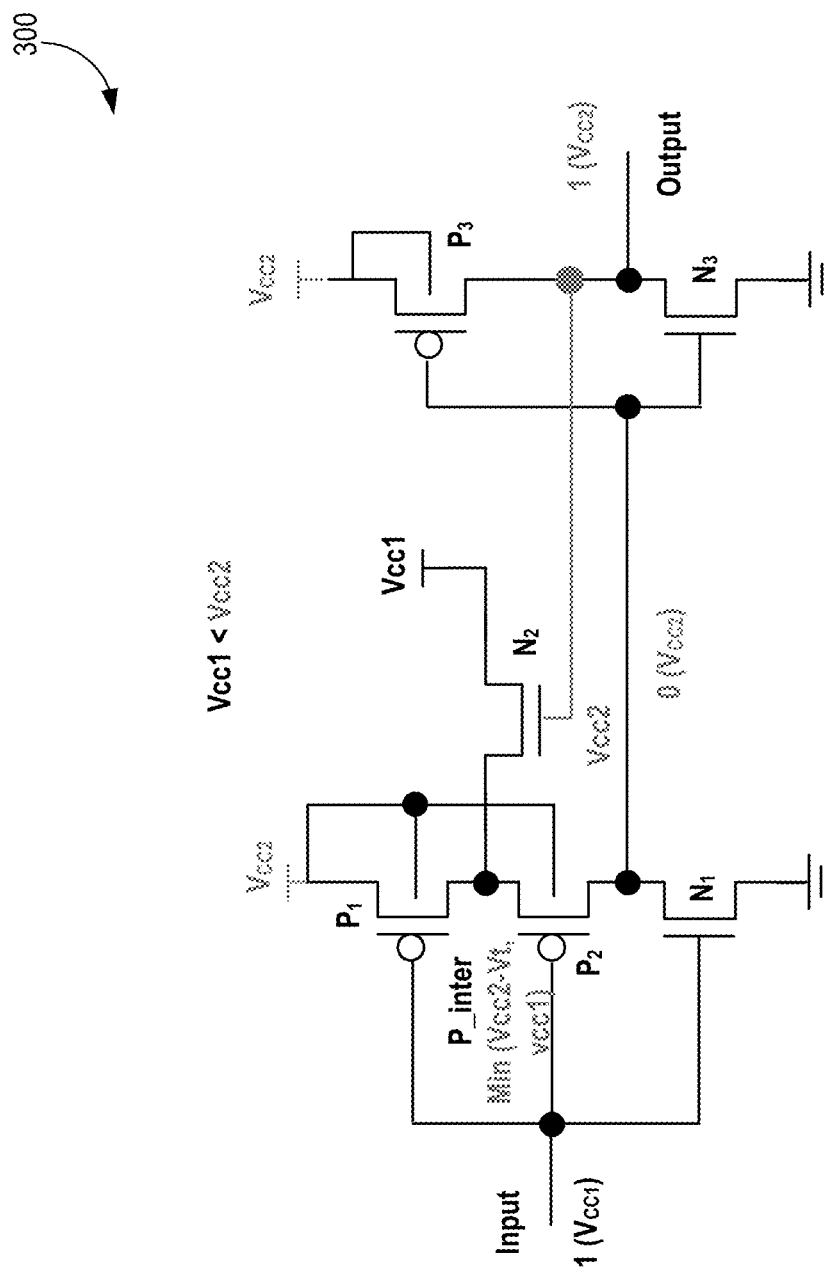
FIGS. 3-4 illustrate circuit schematic of CSLS operations, respectively, to shift a signal from a low supply domain to a high supply domain, in accordance with some embodiments.
Figure 4:
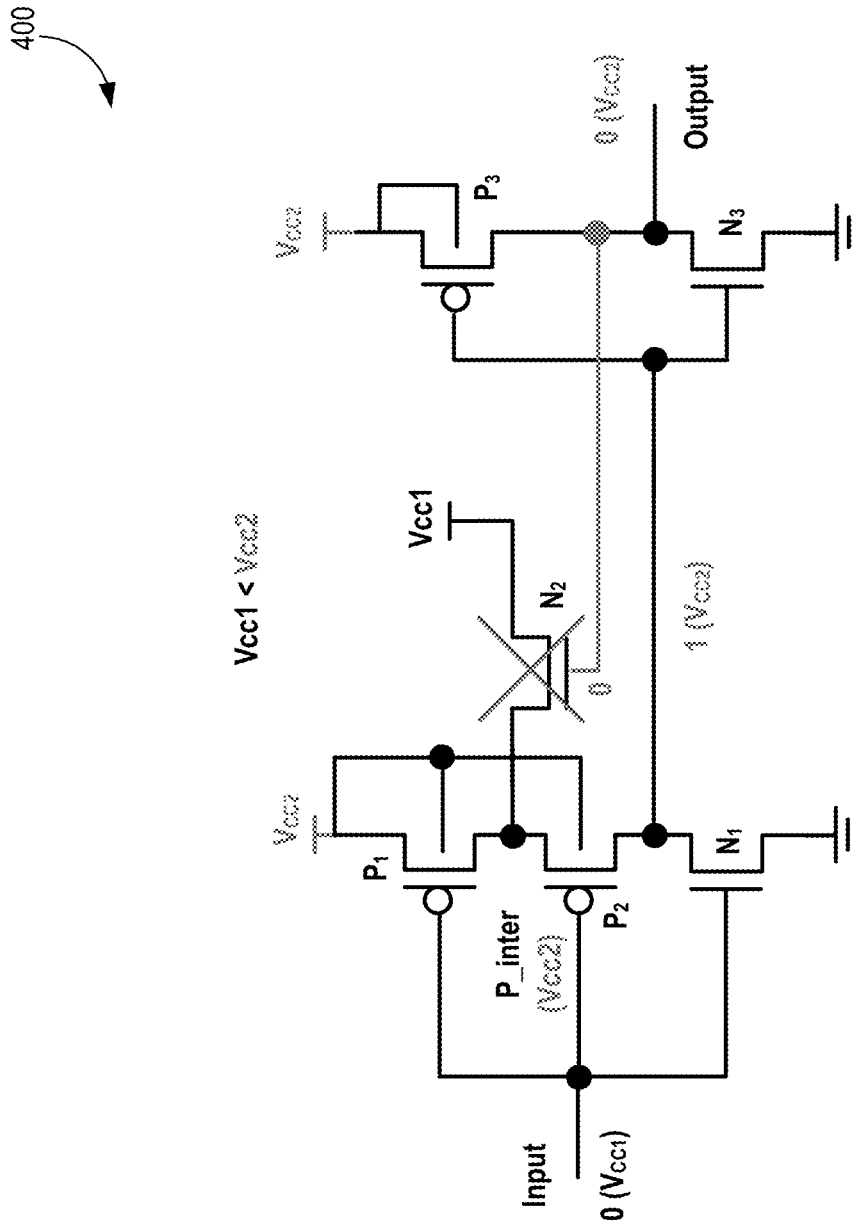

FIGS. 3-4 illustrate circuit schematics 300 and 400 of CSLS operations, respectively, to shift a signal from a low supply domain (Vcc1) to a high supply domain (Vcc2), in accordance with some embodiments. Schematics 300 and 400 are for the same CSLS but for their operation. CSLS comprises a p-stacked inverter comprising p-type transistors $P_1$ and $P_2$, and n-type transistor $N_1$ coupled in series such that transistor $P_1$ is coupled to Vcc2 power supply rail and transistor $N_1$ is coupled to ground. The gates of transistors $P_1$, $P_2$, and $N_1$ are coupled to an input node "Input" which is generated by a logic (not shown) operative with Vcc1. CSLS comprises another inverter including p-type transistor $P_3$ and n-type transistor $N_3$ coupled in series. The gates of transistor $P_3$ and $N_3$ are coupled to the drain terminals of transistors $P_2$ and $N_1$. The drain terminals of transistors $P_3$ and $N_3$ are coupled to the output node "output". The source terminal of transistor $P_3$ is coupled Vcc2 while the source terminal of transistor $N_3$ is coupled to ground. In some embodiments, an n-type transistor $N_2$ is provided to steer current from Vcc2 to Vcc1 power rails. Transistor $N_2$ is coupled to transistors $P_1$ and $P_2$ at node P_inter, and to Vcc1 power supply rail. The gate of transistor $N_2$ is coupled to the output node. Here, ground is also referred to as the first reference rail, Vcc1 is also referred to a second reference rail, and Vcc2 is also referred to a third reference rail.

FIG. 3 illustrates the low voltage to high voltage operation for the CSLS (e.g., Vcc1 is less than Vcc2). When Input=1 (in the Vcc1 domain), transistors $N_1$ and $P_3$ are turned ON completely, and the output will be at logic 1 (in the Vcc2 domain) turning on transistor $N_2$ (feedback device). Here, transistor $P_1$ is partially ON depending on the ΔV (between Vcc1 and Vcc2). P_inter node attains the minimum value between Vcc2–Vt and Vcc1, and this enables steering of some current to the Vcc1 domain, instead of driving the current to Vss, where Vt is the threshold voltage of the transistor. FIG. 4 illustrates the case when Input=0. Here, when Input=0, current steering may not happen. In this case, there may be some contention between transistors $P_1$ and $N_2$ in the transition, but at the end, the voltage on P_inter node becomes Vcc2 value.

Figure 5:
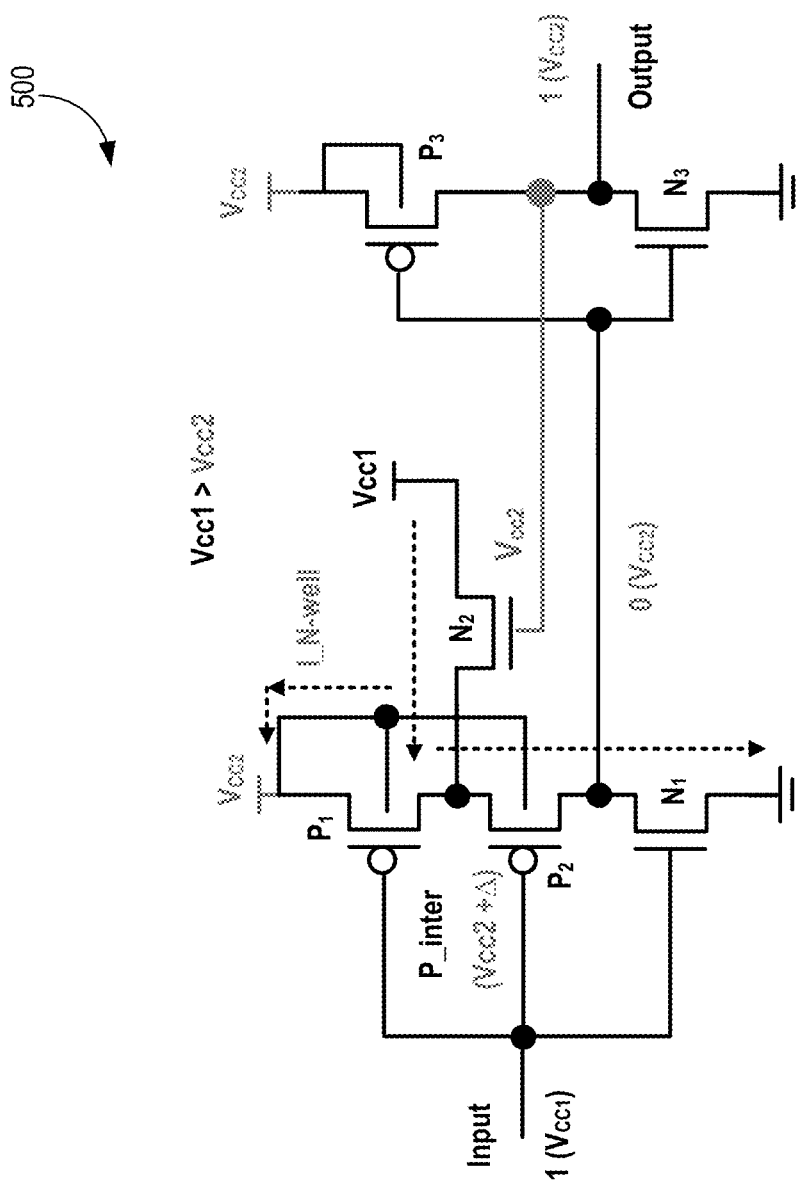
FIGS. 5-6 illustrate a circuit schematic of CSLS operations, respectively, to shift a signal from a high supply domain to a low supply domain, in accordance with some embodiments.
Figure 6:
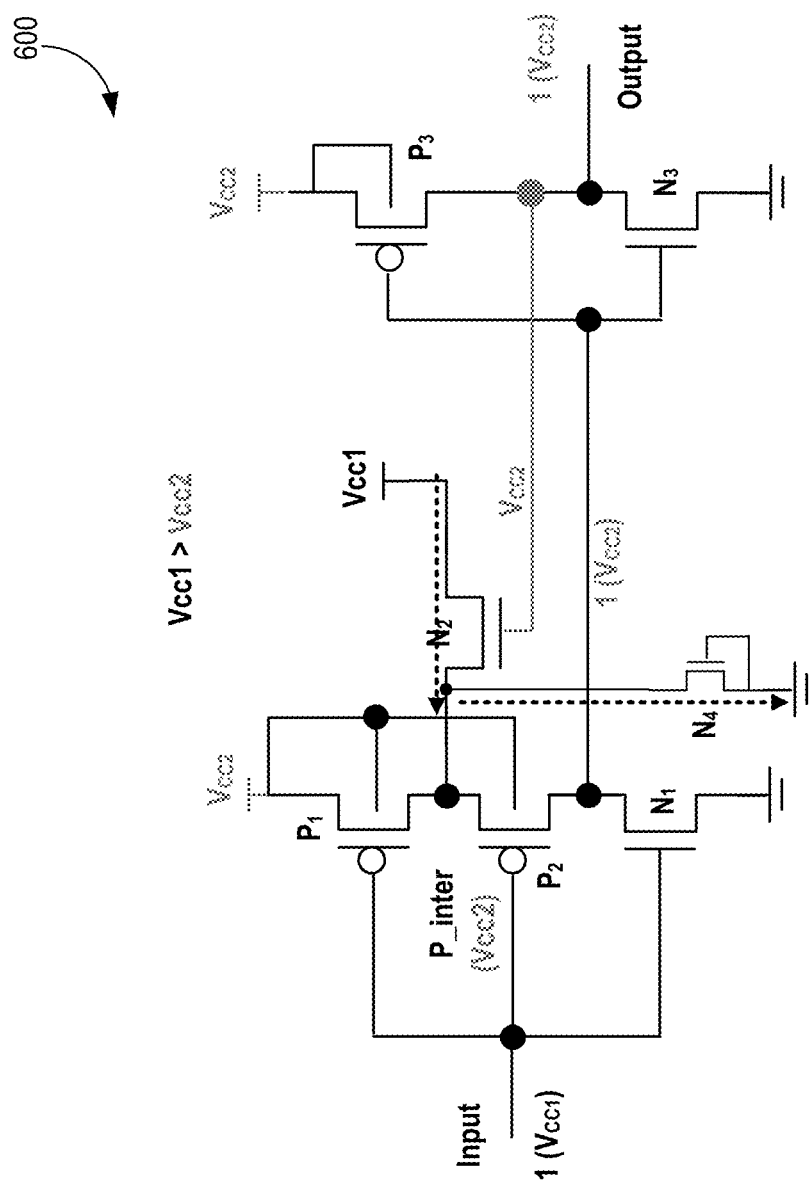

FIGS. 5-6 illustrate circuit schematics 500 and 600 of CSLS operations, respectively, to shift a signal from a high supply domain (Vcc1) to a low supply domain (Vcc2), in accordance with some embodiments. Schematics 500 and 600 are for the same CSLS but for their operation. In the bi-directional scenario (e.g., signal shifting from Vcc2 to Vcc1 power domain), when input=0, transistor $N_2$ is OFF. Extra considerations may need to be taken when input=1 (high-voltage domain). Transistors $P_1$ and $P_2$ are super cutoff when input=1, in this case. Voltage on P_inter node may be between Vcc1 and Vcc2 in such a way that transistor $P_2$ sub-threshold current is balanced by transistor $N_2$ sub-threshold current. P_inter node is in a high impedance state (e.g., transistors $P_1$, $P_2$, and $N_2$ are all cutoff) and the P_inter node can rise above Vcc2 voltage level depending on P, N threshold voltages (Vt) and the voltage differential.

This may result in N-well forward biasing at the drain junction of transistor $P_1$ and the source junction of transistor $P_2$ due to floating P_inter node. As such, the risk of latch-up increases at the receiving voltage domains. The voltage rise at the P_inter node can be mitigated by connecting a bleeder transistor $N_4$ between P_inter node and Vss. Transistor $N_4$, with its gate terminal tied to Vss, provides a small constant current leakage path and stabilizes the voltage on P_inter node below the Vcc2 level. Transistor $N_4$ with its VGS=0V may not operate in super-cutoff region as transistor $N_2$. This drops a finite Vds drop across transistor $N_2$ resulting in the voltage on the P_inter node settling below Vcc2 level. As such, the N-well forward biasing scenario is avoided.

Figure 7:
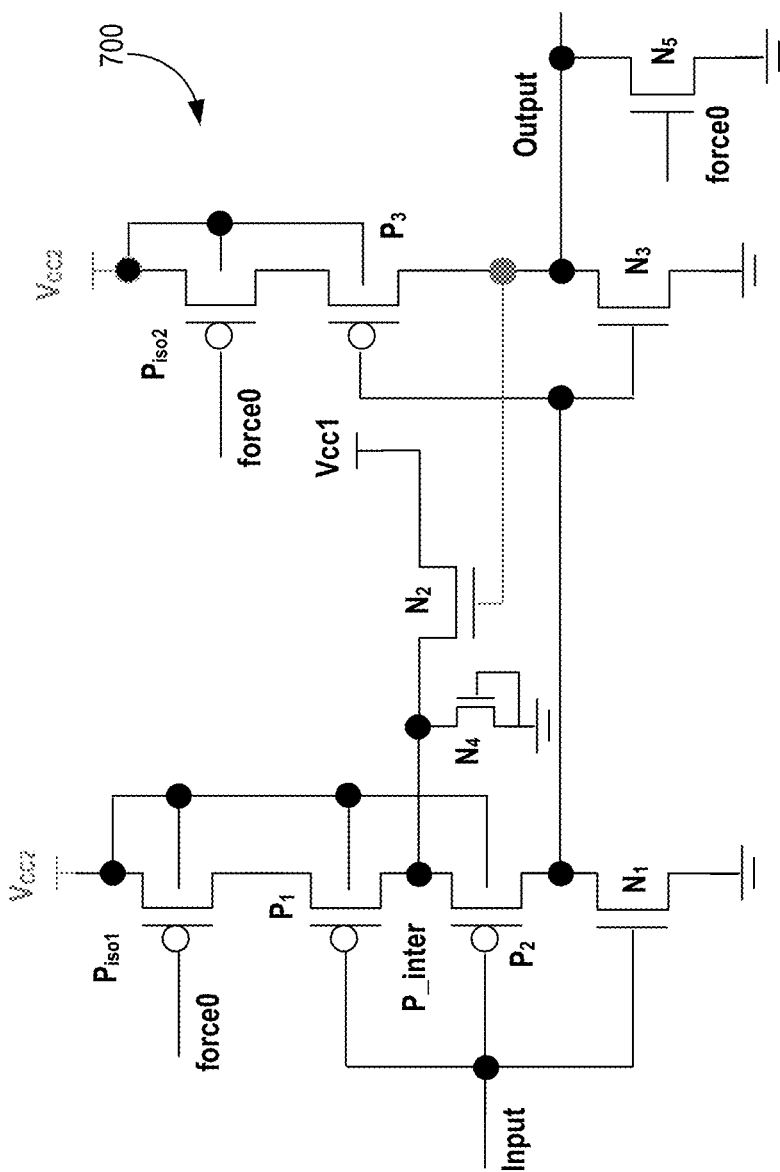
FIG. 7 illustrates a circuit schematic of a deterministic CSLS, in accordance with some embodiments.

FIG. 7 illustrates circuit schematic 700 of a deterministic CSLS, in accordance with some embodiments. CSLS of FIG. 7 comprises a p-stacked inverter comprising p-type transistors $P_{iso1}$, $P_1$ and $P_2$, and n-type transistor $N_1$ coupled in series such that transistor $P_{iso1}$ is coupled to Vcc2 power supply rail and transistor $N_1$ is coupled to ground. The gates of transistors $P_1$, $P_2$, and $N_1$ are coupled to an input node "Input" which is generated by a logic (not shown) operative with Vcc1. The gate of transistor $P_{iso1}$ is coupled to force0. Force0 controls the current path through the p-stacked inverter. CSLS further comprises another p-stacked inverter including p-type transistor $P_{iso2}$ and $P_3$ and n-type transistor $N_3$ coupled in series. The gates of transistors $P_3$ and $N_3$ are coupled to the drain terminals of transistors $P_2$ and $N_1$. The drain terminals of transistors $P_3$ and $N_3$ are coupled to the output node "output". The source terminal of transistor $P_{iso2}$ is coupled Vcc2 while the source terminal of transistor $N_3$ is coupled to ground. The gate of transistor $P_{iso2}$ is also controlled by force0, which controls the current path through this p-stacked inverter. In some embodiments, an n-type transistor $N_2$ is provided to steer current from Vcc2 to Vcc1 power rails (assuming Vcc1 is less than Vcc2). Transistor $N_2$ is coupled to transistors $P_1$ and $P_2$ at node P_inter, and to Vcc1 power supply rail. The gate of transistor $N_2$ is coupled to the output node.

In some embodiments, n-type transistor $N_4$ is provided to force a deterministic value on the output. For example, the gate of transistor $N_4$ is controlled by force0, which when enabled (e.g., when logic 1) turns off the current paths through the p-stacked inverters (because transistors $P_{iso1}$ and $P_{iso2}$ are turned off) and transistor $N_5$ is on. In normal operation of the CSLS, force( ) is a logic 0. As such, the output function of CSLS of FIG. 7 is given as Output=not (force0)·Input. In various embodiments, force( ) is generated by logic operating on the Vcc2 power supply. However, when force( ) is generated by logic operating on the Vcc1 power supply domain and Vcc1 is lower than Vcc2, then when force( ) is logic 1, there may be small current flowing through the p-stacked inverters. Nevertheless, the output is pulled to ground because of transistor $N_5$ being on. Normal operation wise, the CSLS of FIG. 7 performs as the CSLS of FIGS. 3-6.

Figure 8:
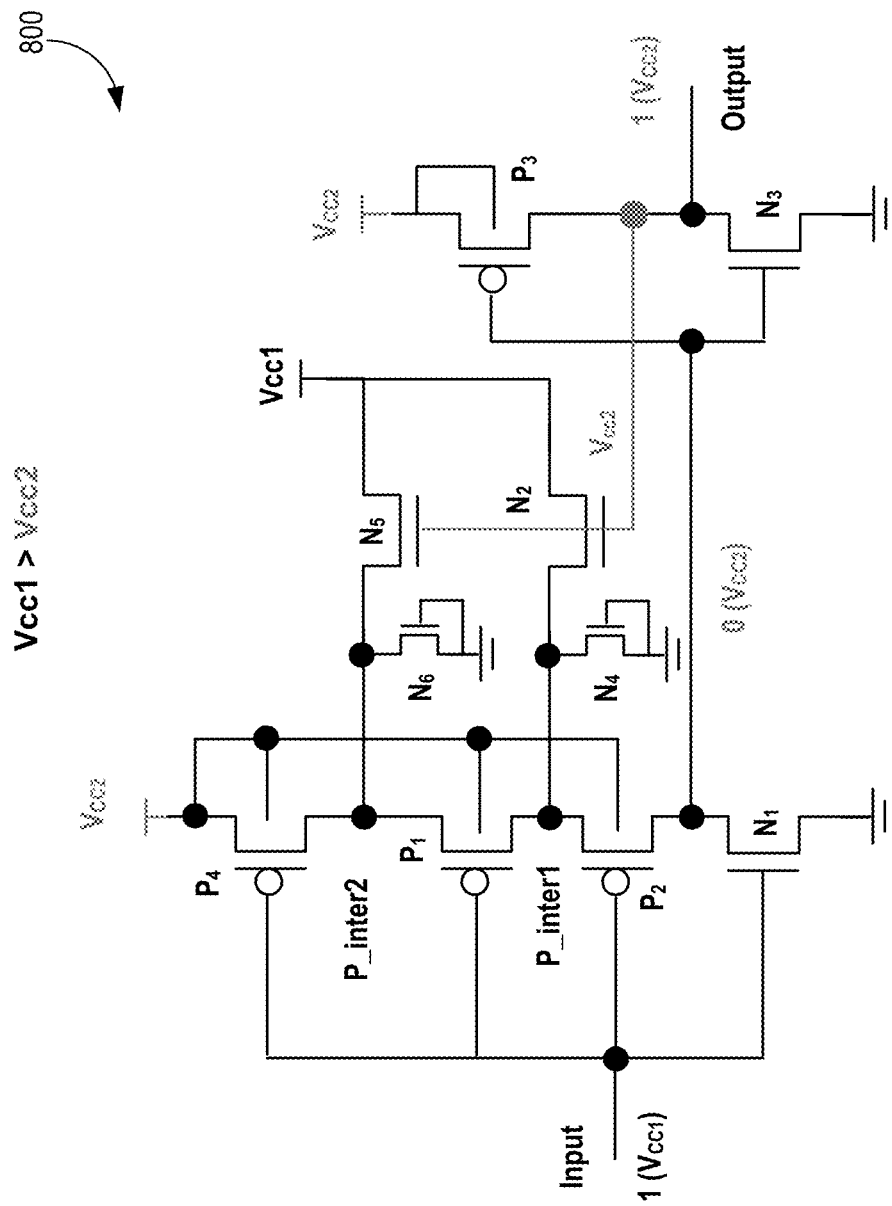
FIG. 8 illustrates a circuit schematic of a CSLS with multiple current steering paths, in accordance with some embodiments.

FIG. 8 illustrates circuit schematic 800 of a CSLS with multiple current steering paths, in accordance with some embodiments. CSLS comprises a p-stacked inverter comprising p-type transistors $P_1$, $P_2$, and $P_4$, and n-type transistor $N_1$ coupled in series such that transistor $P_1$ is coupled to Vcc2 power supply rail and transistor $N_1$ is coupled to ground. The gates of transistors $P_1$, $P_2$, and $P_4$ and $N_1$ are coupled to an input node "Input" which is generated by a logic (not shown) operative with Vcc1. CSLS comprises another inverter including p-type transistor $P_3$ and n-type transistor $N_3$ coupled in series. The gates of transistor $P_3$ and $N_3$ are coupled to the drain terminals of transistors $P_2$ and $N_1$. The drain terminals of transistors $P_3$ and $N_3$ are coupled to the output node "output". The source terminal of transistor $P_3$ is coupled Vcc2 while the source terminal of transistor $N_3$ is coupled to ground. In some embodiments, a first n-type transistor $N_4$ is provided to steer current from Vcc2 to Vcc1 power rails. Transistor $N_4$ is coupled to transistors $P_1$ and $P_2$ at node P_inter1, and to Vcc1 power supply rail. The gate of transistor $N_4$ is coupled to the output node. In some embodiments, a second n-type transistor $N_5$ is provided to steer current from Vcc2 to Vcc1 power rails. Transistor $N_5$ is coupled to transistors $P_1$ and $P_4$ at node P_inter2, and to Vcc1 power supply rail. The gate of transistor $N_5$ is coupled to the output node.

To mitigate possible latch-up issues, leaker or bleeder transistors $N_4$ and $N_6$ are provided. The voltage rise at the P_inter1 node can be mitigated by connecting a bleeder transistor $N_4$ between P_inter node1 and Vss. Transistor $N_4$, with its gate terminal tied to Vss, provides a small constant current leakage path and stabilizes the voltage on P_inter1 node below the Vcc2 level. Transistor $N_4$ with its VGS=0V may not operate in super-cutoff region as transistor $N_2$. This drops a finite Vds drop across transistor $N_2$ resulting in the voltage on the P_inter1 node settling below Vcc2 level. As such, the N-well forward biasing scenario is avoided. The same technique is applied to the second feedback path through transistor $N_5$. There, bleeder device $N_6$ is added. The voltage rise at the P_inter2 node can be mitigated by connecting a bleeder transistor $N_6$ between P_inter node1 and Vss. Transistor $N_6$, with its gate terminal tied to Vss, provides a small constant current leakage path and stabilizes the voltage on P_inter2 node below the Vcc2 level. Transistor $N_6$ with its VGS=0V may not operate in super-cutoff region as transistor $N_5$. This drops a finite Vds drop across transistor $N_5$ resulting in the voltage on the P_inter2 node settling below Vcc2 level. FIG. 8 also shows the logic or voltage values for the case when Vcc1 is greater than Vcc1 and the input node is at logic 1 (at Vcc1 level).

Figure 9:
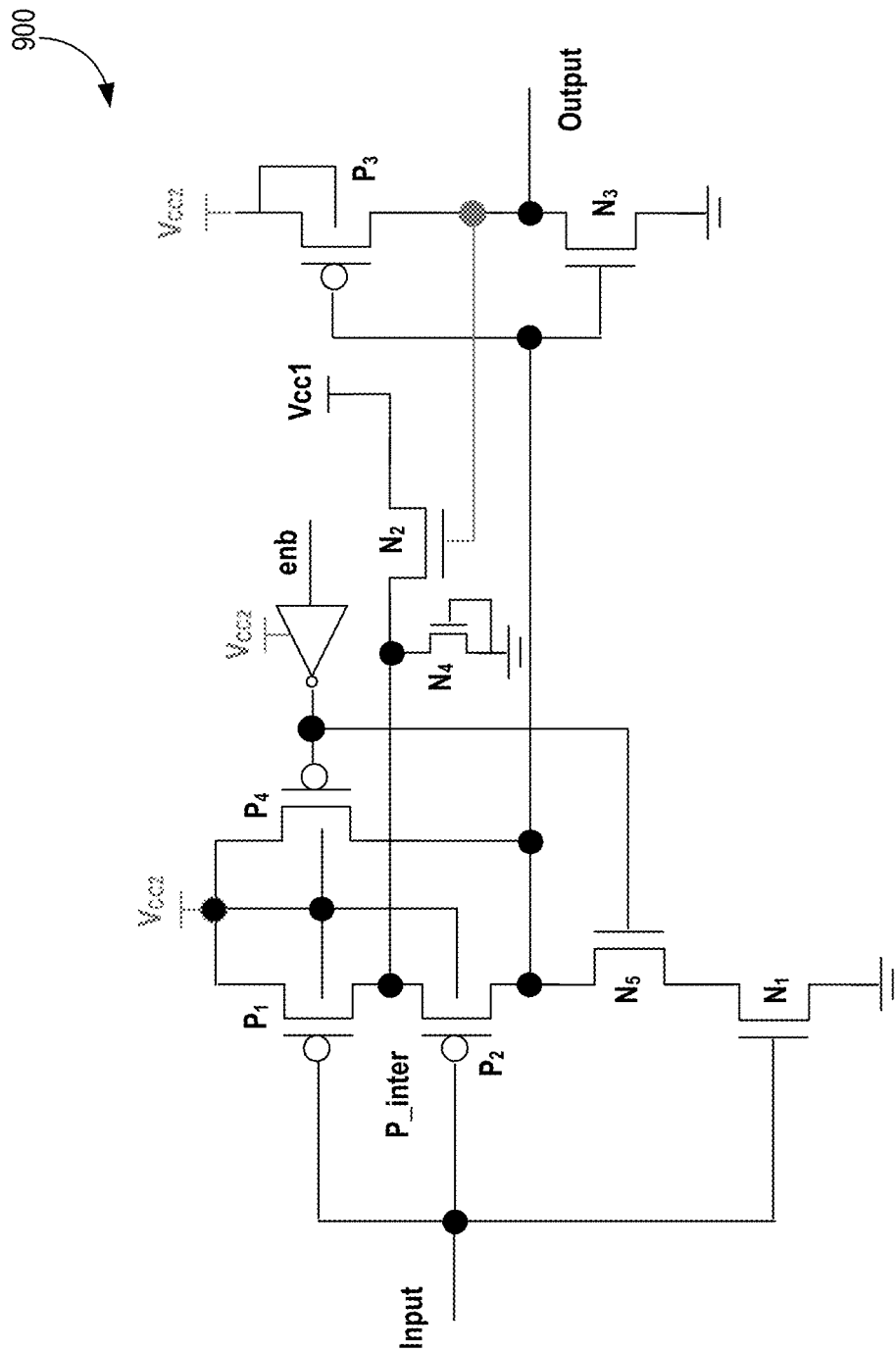
FIG. 9 illustrates a circuit schematic of a CSLS with circuitry to bypass the current steering operation, in accordance with some embodiments.

FIG. 9 illustrates circuit schematic 900 of a CSLS with circuitry to bypass the current steering operation, in accordance with some embodiments. CSLS comprises a p-stacked inverter comprising p-type transistors $P_1$ and $P_2$, and n-type transistors $N_1$ and $N_5$ coupled in series such that transistor $P_1$ is coupled to Vcc2 power supply rail and transistor $N_1$ is coupled to ground. The gates of transistors $P_1$, $P_2$, and $N_1$ are coupled to an input node "Input" which is generated by a logic (not shown) operative with Vcc1. In some embodiments, p-type transistor $P_4$ is provided which is coupled parallel to the series combination of transistors $P_1$ and $P_2$. In some embodiments, p-type transistor $P_4$ is controllable by an enable signal generated by an inverter (or buffer) operating on Vcc2 power supply. In this case, enb (inverse of enable) is used as input to the inverter and used to control transistors $P_4$ and $N_1$.

CSLS comprises another inverter including p-type transistor $P_3$ and n-type transistor $N_3$ coupled in series. The gates of transistor $P_3$ and $N_3$ are coupled to the drain terminals of transistors $P_2$ and $N_5$. The drain terminals of transistors $P_3$ and $N_3$ are coupled to the output node "output". The source terminal of transistor $P_3$ is coupled Vcc2 while the source terminal of transistor $N_3$ is coupled to ground. In some embodiments, an n-type transistor $N_2$ is provided to steer current from Vcc2 to Vcc1 power rails. Transistor $N_2$ is coupled to transistors $P_1$ and $P_2$ at node P_inter, and to Vcc1 power supply rail. The gate of transistor $N_2$ is coupled to the output node.

To mitigate possible latch-up issues, leaker or bleeder transistor $N_4$ is provided. The voltage rise at the P_inter node can be mitigated by connecting a bleeder transistor $N_4$ between P_inter node and Vss. Transistor $N_4$, with its gate terminal tied to Vss, provides a small constant current leakage path and stabilizes the voltage on P_inter node below the Vcc2 level. Transistor $N_4$ with its VGS=0V may not operate in super-cutoff region as transistor $N_2$. This drops a finite Vds drop across transistor $N_2$ resulting in the voltage on the P_inter node settling below Vcc2 level. As such, the N-well forward biasing scenario is avoided.

When enb is logic 0, transistor $P_4$ is off, and transistor $N_3$ is on, and CSLS operates normally as discussed with reference to FIGS. 3-6. Referring back to FIG. 9, when enb is logic 1 (e.g., bypass mode), transistor $P_4$ is on and transistor $N_3$ is turned off, and output is set to 0. In this case, the feedback device $N_2$ is off.

Figure 10:
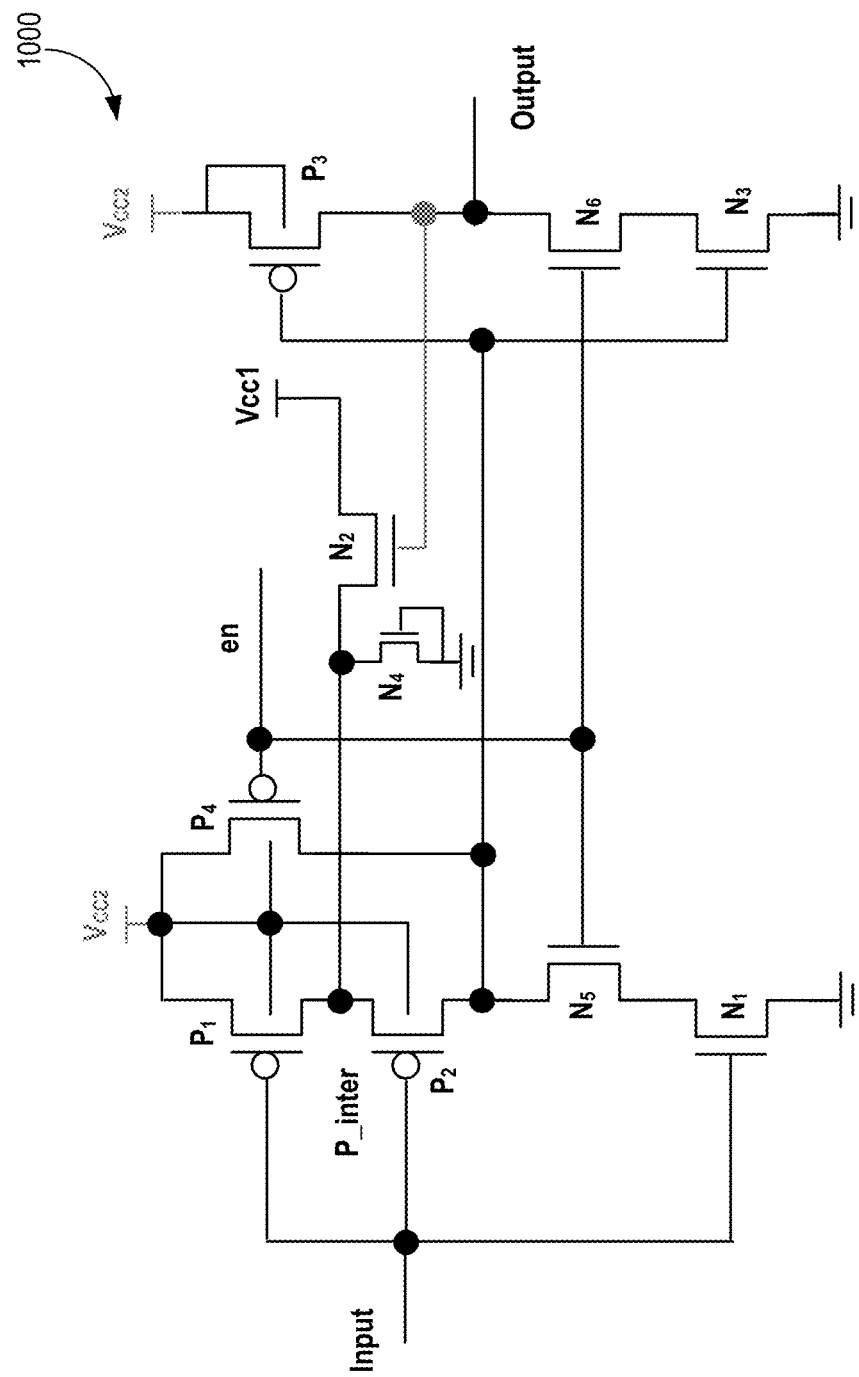
FIG. 10 illustrates another circuit schematic of a CSLS with circuitry to bypass the current steering operation, in accordance with some embodiments.

FIG. 10 illustrates another circuit schematic 1000 of a CSLS with circuitry to bypass the current steering operation, in accordance with some embodiments. CSLS comprises a p-stacked inverter comprising p-type transistors $P_1$ and $P_2$, and n-type transistors $N_1$ and $N_5$ coupled in series such that transistor $P_1$ is coupled to Vcc2 power supply rail and transistor $N_1$ is coupled to ground. The gates of transistors $P_1$, $P_2$, and $N_1$ are coupled to an input node "Input" which is generated by a logic (not shown) operative with Vcc1. In some embodiments, p-type transistor $P_4$ is provided which is coupled parallel to the series combination of transistors $P_1$ and $P_2$. In some embodiments, p-type transistor P4 is controllable by an enable signal en generated by an inverter (or buffer) operating on Vcc2 power supply. The enable signal en is used as input to the inverter and used to control transistors $P_4$ and $N_1$.

CSLS comprises another inverter including p-type transistor $P_3$ and n-type transistors $N_3$ and $N_6$ coupled in series. The gates of transistor $P_3$ and $N_3$ are coupled to the drain terminals of transistors $P_2$ and $N_5$. The drain terminals of transistors $P_3$ and $N_6$ are coupled to the output node "output". The source terminal of transistor $P_3$ is coupled Vcc2 while the source terminal of transistor $N_3$ is coupled to ground. In some embodiments, an n-type transistor $N_2$ is provided to steer current from Vcc2 to Vcc1 power rails. Transistor $N_2$ is coupled to transistors $P_1$ and $P_2$ at node P_inter, and to Vcc1 power supply rail. The gate of transistor $N_2$ is coupled to the output node.

To mitigate possible latch-up issues, leaker or bleeder transistor $N_4$ is provided. The voltage rise at the P_inter node can be mitigated by connecting a bleeder transistor $N_4$ between P_inter node and Vss. Transistor $N_4$, with its gate terminal tied to Vss, provides a small constant current leakage path and stabilizes the voltage on P_inter node below the Vcc2 level. Transistor $N_4$ with its VGS=0V may not operate in super-cutoff region as transistor $N_2$. This drops a finite Vds drop across transistor $N_2$ resulting in the voltage on the P_inter node settling below Vcc2 level. As such, the N-well forward biasing scenario is avoided.

When en is logic 0 (e.g., bypass mode), transistor $P_4$ is on, and transistors $N_5$, $N_6$ are off, output is set to logic 0, and feedback device $N_2$ is Off. When en is logic 1, transistor $P_4$ is off, and transistors $N_5$, $N_6$ are on, and output follows input as in a normal LS operation.

FIGS. 11A-B illustrate plots 1100 and 1120 comparing rise and fall delays of level-shifters of FIGS. 1A-C and the CSLS of FIG. 4, respectively, in accordance with some embodiments. Plot 1100 shows the rise delay for LS 100 (curve 1101), LS 120 (curve 1102) and LS 300 (curve 1103). Here, curve for LS 130 overlaps curve for LS 300. Plot 1120 shows the fall delay for LS 100 (curve 1121), LS 120 (curve 1122) and LS 300 (curve 1123). Here, curve for LS 130 substantially overlaps curve for LS 300.

In this example, VccL is set as input power supply and VccH as output power supply, where VccL is set to 0.525 V, and VccH is varied from 0.525V to 1.025V in steps of 50 mV. The output rise delay in CSLS is 14 ps higher than the output rise delay in LS 100 due to increased contention between transistors $N_1$ and $P_1$, $P_2$ stack and $N_1$ and feedback $N_2$ device. The output fall delay is 37 ps smaller than the output fall delay of LS 100 (ΔVcc=200 mV) due to reduced internal node toggling. The same technical effects are seen with other CSLS of various embodiments described here.

FIGS. 12A-B illustrate plots 1200 and 1220 comparing Vss (or ground) current of level-shifters of FIGS. 1A-C and the CSLS of FIG. 4, respectively, in accordance with some embodiments. Plot 1200 shows the Vss current when input is logic 0 for LS 100 (curve 1201), LS 130 (curve 1202) and LS 300 (curve 1203). Here, curve for LS 100 overlaps curve for LS 120. Plot 1220 shows the Vss current when input is at logic 1 for LS 100 (curve 1221), LS 120 (curve 1222), LS 130 (1223), and LS 300 (curve 1224).

The plots show the leakage current comparison for input=0 and input=1 for low to high Vcc conversion. When input=0V, CSLS 300 consumes marginally lower Vss leakage compared to the LS 100 due to reduced number of transistor stages as shown by plot 1200. When input=1, the proposed CSLS consumes 15 nA higher Vss leakage compared to the LS 100 but significantly lower Vss current compared to the simple inverter or P-stack buffer 1300 as shown by plot 1220. Lower Vss leakage indicates the effective current steering mechanism in CSLS 300. The same technical effects are seen with other CSLS of various embodiments described here.

Figure 13A:
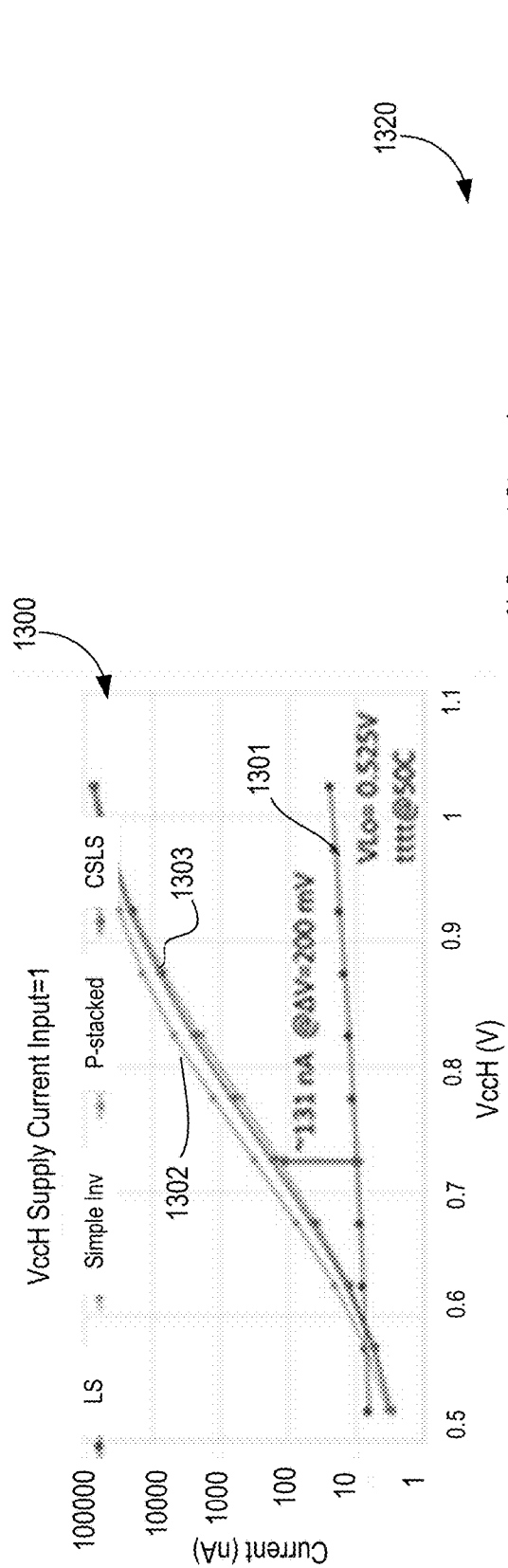
FIGS. 13A-B illustrate plots comparing VccH (or high supply rail) current of level-shifters of FIGS. 1A-C and the CSLS of FIG. 4, in accordance with some embodiments.
Figure 13B:
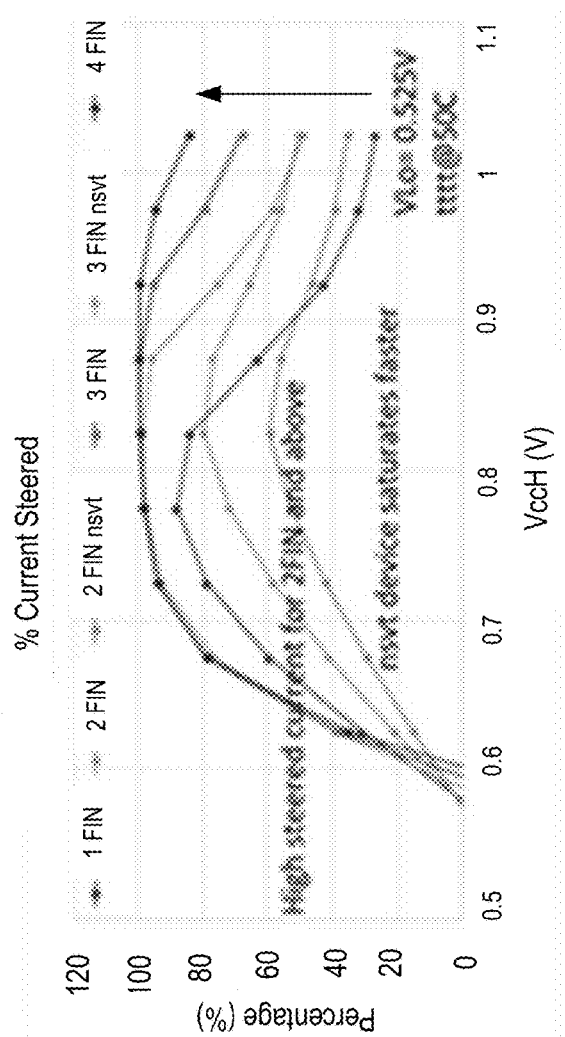

FIGS. 13A-B illustrate plots 1300 and 1320 comparing VccH (or high supply rail) current of level-shifters of FIGS. 1A-C and the CSLS of FIG. 4, respectively, in accordance with some embodiments. Plot 1300 shows the VccH current when input is logic 1 for LS 100 (curve 1301), LS 120 (curve 1302) and CSLS 300 (curve 1303). Here, curve for LS 130 overlaps curve for various number of fins for FinFET transistors.

LS 100 supply current increases sharply with increasing supply differential in the LS. This is due to exponentially increasing the sub-threshold current of the $P_1$ transistor as shown by plot 1300. In the CSLS topology (e.g., CSLS 300), significant portion of the high supply leakage current is transferred to the low voltage rail instead of Vss rail (as happens in the simple inverter or P-stacked cases) as shown in plot 1320. By increasing the feedback device $N_2$ size and lowering the threshold voltage, large percentage (e.g., 94%) of the current from high supply rail is steered into lower supply rail effectively. Here, the current steering mechanism is effective over a wide voltage differential and reduces eventually when the supply voltage differential is about the threshold voltage of the transistor $P_1$. In some embodiments, bleeder device $N_4$ sizing has insignificant impact on the current steering efficiency.

Figure 14:
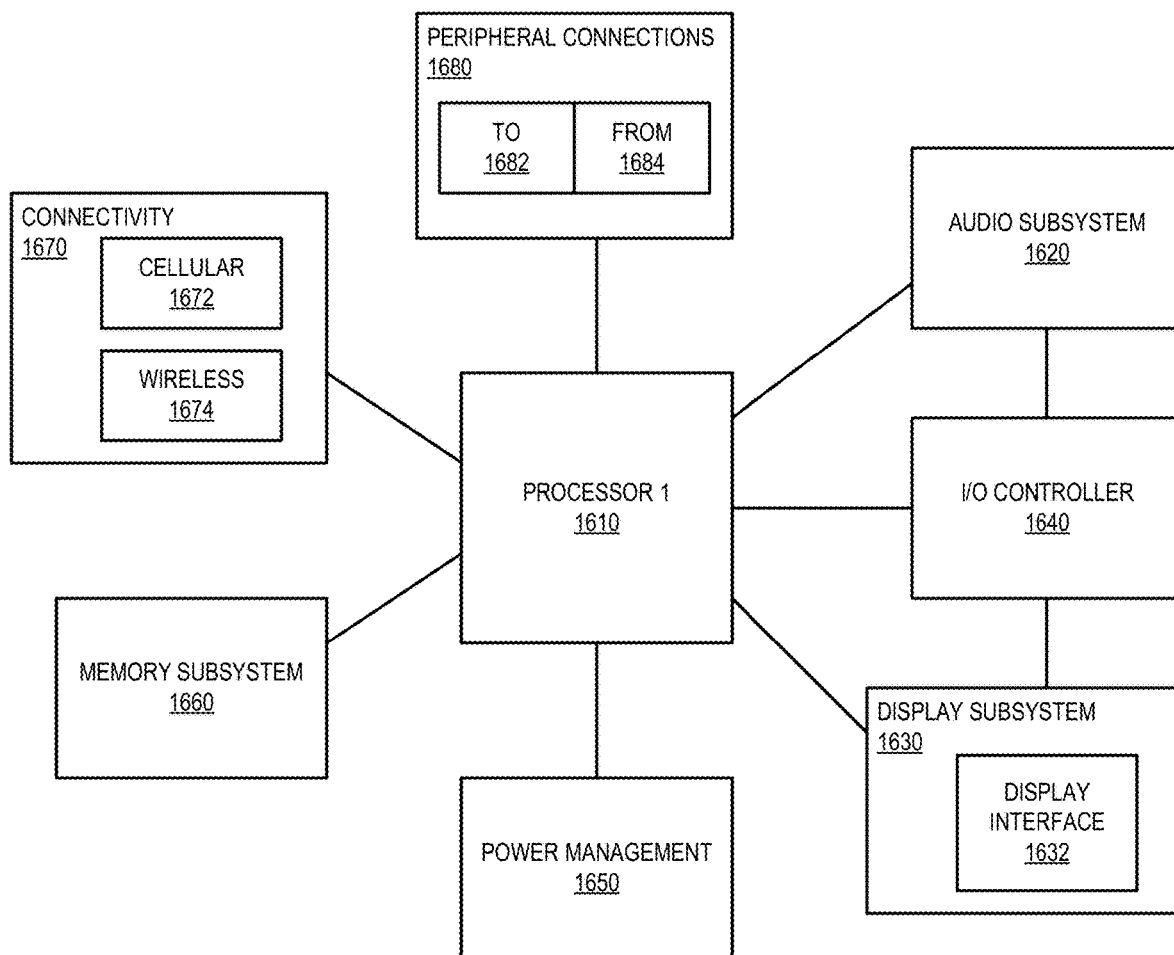
FIG. 14 illustrates a smart device or a computer system or a SoC (System-on-Chip) with a CSLS, according to some embodiments of the disclosure.

FIG. 14 illustrates a smart device or a computer system or a SoC (System-on-Chip) with a CSLS, according to some embodiments of the disclosure. FIG. 14 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with a CSLS, according to some embodiments discussed. Other blocks of the computing device 1600 may also include with a CSLS, according to some embodiments.

The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1

An apparatus comprising: an input to receive a first signal between a first reference rail and a second reference rail; an output to provide a second signal the first reference rail and a third reference rail, wherein in a voltage level of the third reference rail is higher than a voltage level of the second reference rail, and wherein a voltage level of the first reference is lower than the voltage level of the second reference rail and the third reference rail; and a circuitry coupled to the input and the output, wherein the circuitry is to steer current from the third reference rail to the second reference rail.

Example 2

The apparatus of claim 1, wherein the circuitry comprises: a first p-type transistor coupled to the third reference rail and the input; a second p-type transistor coupled in series with the first p-type transistor and coupled to the input; and a first n-type transistor coupled in series with the second p-type transistor, the input, and the first reference rail.

Example 3

The apparatus of claim 2, wherein the circuitry comprises a second n-type transistor coupled to the first and second p-type transistors and coupled to the second reference rail.

Example 4

The apparatus of claim 3, wherein the circuitry comprises an inverter coupled to the third and first reference rails, wherein the inverter comprises an input coupled to the second p-type transistor and the first n-type transistor, and wherein the inverter comprises an output coupled to the output and the second n-type transistor.

Example 5

The apparatus of claim 3, wherein the circuitry comprises: a third p-type transistor coupled to the third reference rail, the first and second n-type transistors, the second p-type transistor, and the output; and a third n-type transistor coupled in series with the third p-type transistor, wherein the third n-type transistor is coupled to the first reference rail, the first and second n-type transistors, the second p-type transistor, and the output.

Example 6

The apparatus of claim 5 comprises a fourth n-type transistor coupled to the second n-type device and the first and second p-type transistors.

Example 7

The apparatus of claim 6 comprises a fifth n-type transistor coupled in parallel to the third n-type transistor, wherein the fifth n-type transistor is to discharge a voltage on the output to the first reference rail when the fifth n-type transistor is turned on.

Example 8

The apparatus of claim 1 comprises a first logic to generate the first signal, wherein current drawn by the first logic is lower than the steered current, wherein the first logic is coupled to the first and second reference rails.

Example 9

The apparatus of claim 1 comprise a second logic to receive the second signal, wherein the second logic is coupled to the first and third reference rails.

Example 10

An apparatus comprising: an input to receive a first signal between a first reference rail and a second reference rail; an output to provide a second signal the first reference rail and a third reference rail, wherein in a voltage level of the third reference rail is higher than a voltage level of the second reference rail, and wherein a voltage level of the first reference is lower than the voltage level of the second reference rail and the third reference rail; and a circuitry coupled to the input and the output, wherein the circuitry is to steer a first current from the third reference rail to the second reference rail, and is to steer a second current from the third reference rail to the second reference rail, wherein the first and second currents flow through separate electrical paths.

Example 11

The apparatus of claim 10, wherein the circuitry comprises: a first p-type transistor coupled to the third reference rail and the input; a second p-type transistor coupled in series with the first p-type transistor and coupled to the input; a third p-type transistor coupled in series with the second p-type transistor and coupled to the input; and a first n-type transistor coupled in series with the third p-type transistor, the input, and the first reference rail.

Example 12

The apparatus of claim 11, wherein the circuitry comprises a second n-type transistor coupled to the first and second p-type transistors and coupled to the second reference rail.

Example 13

The apparatus of claim 12, wherein the circuitry comprises a third n-type transistor coupled to the second and third p-type transistors and coupled to the second reference rail.

Example 14

The apparatus of claim 13 comprises an inverter coupled to the third and first reference rails, wherein the inverter comprises an input coupled to the third p-type transistor and the first n-type transistor, and wherein the inverter comprises an output coupled to the output and the second and third n-type transistors.

Example 15

The apparatus of claim 13, wherein the circuitry comprises: a fourth p-type transistor coupled to the third reference rail, the first, second, and third n-type transistors, the third p-type transistor, and the output; and a fourth n-type transistor coupled in series with the fourth p-type transistor, wherein the fourth n-type transistor is coupled to the first reference rail, the first, second, and third n-type transistors, the third p-type transistor, and the output.

Example 16

The apparatus of claim 10 comprises a first logic to generate the first signal, wherein current drawn by the first logic is lower than the steered current, wherein the first logic is coupled to the first and second reference rails.

Example 17

The apparatus of claim 10 comprise a second logic to receive the second signal, wherein the second logic is coupled to the first and third reference rails.

Example 18

A system comprising: a memory; a processor coupled to the memory, wherein the processor comprises a first power domain and a second power domain, wherein the processor comprises a level-shifter coupled to the first and second power domains, wherein the level-shifter comprises: an input to receive a first signal between a first reference rail and a second reference rail; an output to provide a second signal the first reference rail and a third reference rail, wherein in a voltage level of the third reference rail is higher than a voltage level of the second reference rail, and wherein a voltage level of the first reference is lower than the voltage level of the second reference rail and the third reference rail; and a circuitry coupled to the input and the output, wherein the circuitry is to steer current from the third reference rail to the second reference rail, wherein the second reference rail corresponds to the first power domain, and wherein the third reference rail corresponds to the second power domain; and a wireless interface to allow the processor to communicate with another device.

Example 19

The system of claim 18, wherein the circuitry comprises: a first p-type transistor coupled to the third reference rail and the input; a second p-type transistor coupled in series with the first p-type transistor and coupled to the input; a first n-type transistor coupled in series with the second p-type transistor, the input, and the first reference rail; and a second n-type transistor coupled to the first and second p-type transistors and coupled to the second reference rail.

Example 20

The system of claim 19, wherein the circuitry comprises an inverter coupled to the third and first reference rails, wherein the inverter comprises an input coupled to the second p-type transistor and the first n-type transistor, and wherein the inverter comprises an output coupled to the output and the second n-type transistor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
an input to receive a first signal between a first reference rail and a second reference rail;
an output to provide a second signal between the first reference rail and a third reference rail, wherein a voltage level of the third reference rail is higher than a voltage level of the second reference rail, and wherein a voltage level of the first reference is lower than the voltage level of the second reference rail and the third reference rail; and
a circuitry coupled to the input and the output, wherein the circuitry is to steer current from the third reference rail to the second reference rail; and
a logic to generate the first signal, wherein current drawn by the logic is lower than the steered current.

2. The apparatus of claim 1, wherein the circuitry comprises:
a first p-type transistor coupled to the third reference rail and the input;
a second p-type transistor coupled in series with the first p-type transistor and coupled to the input; and a first n-type transistor coupled in series with the second p-type transistor, the input, and the first reference rail.

3. The apparatus of claim 2, wherein the circuitry comprises a second n-type transistor coupled to the first and second p-type transistors and coupled to the second reference rail.

4. The apparatus of claim 3, wherein the circuitry comprises an inverter coupled to the third and first reference rails, wherein the inverter comprises an input coupled to the second p-type transistor and the first n-type transistor, and wherein the inverter comprises an output coupled to the output and the second n-type transistor.

5. The apparatus of claim 3, wherein the circuitry comprises:
 a third p-type transistor coupled to the third reference rail, the first and second n-type transistors, the second p-type transistor, and the output; and
 a third n-type transistor coupled in series with the third p-type transistor, wherein the third n-type transistor is coupled to the first reference rail, the first and second n-type transistors, the second p-type transistor, and the output.

6. The apparatus of claim 5 comprises a fourth n-type transistor coupled to the second n-type device and the first and second p-type transistors.

7. The apparatus of claim 6 comprises a fifth n-type transistor coupled in parallel to the third n-type transistor, wherein the fifth n-type transistor is to discharge a voltage on the output to the first reference rail when the fifth n-type transistor is turned on.

8. The apparatus of claim 1 wherein the logic is coupled to the first and second reference rails.

9. The apparatus of claim 1, wherein the logic is a first logic, wherein the apparatus comprises a second logic to receive the second signal, and wherein the second logic is coupled to the first and third reference rails.

10. An apparatus comprising:
 an input to receive a first signal between a first reference rail and a second reference rail;
 an output to provide a second signal between the first reference rail and a third reference rail, wherein a voltage level of the third reference rail is higher than a voltage level of the second reference rail, and wherein a voltage level of the first reference is lower than the voltage level of the second reference rail and the third reference rail;
 a circuitry coupled to the input and the output, wherein the circuitry is to steer a first current from the third reference rail to the second reference rail, and is to steer a second current from the third reference rail to the second reference rail, and wherein the first and second currents flow through separate electrical paths; and
 a logic to generate the first signal, wherein current drawn by the logic is lower than the steered current.

11. The apparatus of claim 10, wherein the circuitry comprises:
 a first p-type transistor coupled to the third reference rail and the input;
 a second p-type transistor coupled in series with the first p-type transistor and coupled to the input;
 a third p-type transistor coupled in series with the second p-type transistor and coupled to the input; and
 a first n-type transistor coupled in series with the third p-type transistor, the input, and the first reference rail.

12. The apparatus of claim 11, wherein the circuitry comprises a second n-type transistor coupled to the first and second p-type transistors and coupled to the second reference rail.

13. The apparatus of claim 12, wherein the circuitry comprises a third n-type transistor coupled to the second and third p-type transistors and coupled to the second reference rail.

14. The apparatus of claim 13 comprises an inverter coupled to the third and first reference rails, wherein the inverter comprises an input coupled to the third p-type transistor and the first n-type transistor, and wherein the inverter comprises an output coupled to the output and the second and third n-type transistors.

15. The apparatus of claim 13, wherein the circuitry comprises:
 a fourth p-type transistor coupled to the third reference rail, the first, second, and third n-type transistors, the third p-type transistor, and the output; and
 a fourth n-type transistor coupled in series with the fourth p-type transistor, wherein the fourth n-type transistor is coupled to the first reference rail, the first, second, and third n-type transistors, the third p-type transistor, and the output.

16. The apparatus of claim 10, wherein the logic is coupled to the first and second reference rails.

17. The apparatus of claim 16, wherein the logic is a first logic, and wherein the apparatus comprises a second logic to receive the second signal, wherein the second logic is coupled to the first and third reference rails.

18. A system comprising:
 a memory;
 a processor coupled to the memory, wherein the processor comprises a first power domain and a second power domain, wherein the processor comprises a level-shifter coupled to the first and second power domains, wherein the level-shifter comprises:
  an input to receive a first signal between a first reference rail and a second reference rail;
  an output to provide a second signal between the first reference rail and a third reference rail, wherein a voltage level of the third reference rail is higher than a voltage level of the second reference rail, and wherein a voltage level of the first reference is lower than the voltage level of the second reference rail and the third reference rail;
  a circuitry coupled to the input and the output, wherein the circuitry is to steer current from the third reference rail to the second reference rail, wherein the second reference rail corresponds to the first power domain, and wherein the third reference rail corresponds to the second power domain; and
  a logic to generate the first signal, wherein current drawn by the logic is lower than the steered current; and
 a wireless interface to allow the processor to communicate with another device.

19. The system of claim 18, wherein the circuitry comprises:
 a first p-type transistor coupled to the third reference rail and the input;
 a second p-type transistor coupled in series with the first p-type transistor and coupled to the input;
 a first n-type transistor coupled in series with the second p-type transistor, the input, and the first reference rail; and a second n-type transistor coupled to the first and second p-type transistors and coupled to the second reference rail.

20. The system of claim 19, wherein the circuitry comprises an inverter coupled to the third and first reference rails, wherein the inverter comprises an input coupled to the second p-type transistor and the first n-type transistor, and wherein the inverter comprises an output coupled to the output and the second n-type transistor.

* * * * *